(12) United States Patent
Kim

(10) Patent No.: US 11,171,270 B2
(45) Date of Patent: Nov. 9, 2021

(54) DISPLAY APPARATUS

(71) Applicant: SAMSUNG DISPLAY CO., LTD., Yongin-si (KR)

(72) Inventor: Mugyeom Kim, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 15/917,001

(22) Filed: Mar. 9, 2018

(65) Prior Publication Data

US 2018/0198042 A1 Jul. 12, 2018

Related U.S. Application Data

(63) Continuation of application No. 15/484,456, filed on Apr. 11, 2017, now Pat. No. 9,917,235.

(30) Foreign Application Priority Data

Apr. 11, 2016 (KR) ........................ 10-2016-0044263

(51) Int. Cl.
| | |
|---|---|
| *H01L 33/58* | (2010.01) |
| *H01L 25/075* | (2006.01) |
| *H01L 25/16* | (2006.01) |
| *H01L 27/12* | (2006.01) |
| *H01L 33/10* | (2010.01) |
| *H01L 33/40* | (2010.01) |
| *H01L 33/44* | (2010.01) |
| *H01L 33/46* | (2010.01) |
| *H01L 33/54* | (2010.01) |
| *H01L 33/60* | (2010.01) |
| *H01L 33/62* | (2010.01) |

(52) U.S. Cl.
CPC .......... *H01L 33/58* (2013.01); *H01L 25/0753* (2013.01); *H01L 25/167* (2013.01); *H01L 27/1203* (2013.01); *H01L 33/10* (2013.01); *H01L 33/405* (2013.01); *H01L 33/44* (2013.01); *H01L 33/46* (2013.01); *H01L 33/54* (2013.01); *H01L 33/60* (2013.01); *H01L 33/62* (2013.01); *H01L 27/1214* (2013.01); *H01L 2933/0083* (2013.01); *H01L 2933/0091* (2013.01)

(58) Field of Classification Search
CPC ..... H01L 27/1203; H01L 33/44; H01L 33/46; H01L 33/10; H01L 33/405; H01L 33/486
See application file for complete search history.

(56) References Cited

U.S. PATENT DOCUMENTS

| | | | |
|---|---|---|---|
| 8,373,928 B2 | 2/2013 | Ha et al. | |
| 9,196,873 B1* | 11/2015 | Chang | H01L 51/5209 |
| 9,917,235 B2* | 3/2018 | Kim | H01L 25/0753 |
| 10,135,034 B1* | 11/2018 | Bita | H01L 51/5284 |
| 2010/0072470 A1* | 3/2010 | Yamazaki | H01L 27/0266 |
| | | | 257/43 |
| 2012/0256217 A1 | 10/2012 | Li et al. | |
| 2013/0015482 A1 | 1/2013 | Su | |

(Continued)

FOREIGN PATENT DOCUMENTS

KR 1020080094202 A 10/2008

*Primary Examiner* — Stephen M Bradley
(74) *Attorney, Agent, or Firm* — Cantor Colburn LLP

(57) ABSTRACT

A display apparatus includes a substrate, a light-emitting diode ("LED") provided above the substrate, an insulating layer provided above the LED, and a wire grid polarizer ("WGP") provided above the insulating layer.

17 Claims, 5 Drawing Sheets

(56) References Cited

U.S. PATENT DOCUMENTS

| | | | |
|---|---|---|---|
| 2013/0169515 A1* | 7/2013 | Prushinskiy | G06F 1/1652 |
| | | | 345/55 |
| 2014/0027738 A1 | 1/2014 | Lee | |
| 2014/0159043 A1* | 6/2014 | Sakariya | H01L 27/124 |
| | | | 257/59 |
| 2014/0339495 A1* | 11/2014 | Bibl | H01L 33/504 |
| | | | 257/13 |
| 2016/0195775 A1 | 7/2016 | Lee et al. | |
| 2016/0259210 A1 | 9/2016 | Kim et al. | |
| 2016/0351548 A1* | 12/2016 | Chen | H01L 25/0753 |
| 2017/0038519 A1 | 2/2017 | Kim et al. | |
| 2017/0176184 A1 | 6/2017 | Lee et al. | |
| 2017/0176661 A1 | 6/2017 | Lee et al. | |
| 2017/0176668 A1 | 6/2017 | Itou et al. | |
| 2017/0179192 A1* | 6/2017 | Zhang | H01L 27/156 |
| 2017/0271421 A1* | 9/2017 | Jinbo | H01L 27/3258 |
| 2018/0226543 A1* | 8/2018 | Masui | H01L 33/46 |

\* cited by examiner

DISPLAY APPARATUS

This application is a continuation of U.S. patent application Ser. No. 15/484,456, filed on Apr. 11, 2017, which claims priority to Korean Patent Application No. 10-2016-0044263, filed on Apr. 11, 2016, and all the benefits accruing therefrom under 35 U.S.C. § 119, the content of which in its entirety is herein incorporated by reference.

BACKGROUND

1. Field

One or more exemplary embodiments relate to display apparatuses, and more particularly, to a display apparatus having improved reliability and visibility.

2. Description of the Related Art

A light-emitting diode ("LED") is a device that converts an electric signal into a form of light, such as an infrared light or visible light, by characteristics of a compound semiconductor. Areas of use of the LED are gradually increasing, and the LED is extensively used in a variety of fields of electronic devices from a miniature hand-held electronic device to a large display apparatus, such as a home appliance, a remote controller, an electronic display board, and an automation device.

SUMMARY

When a conventional display apparatus uses a light emitting device including an organic emission material, not only does the organic emission material have a characteristic of being vulnerable to an external environment but also visibility of the conventional display apparatus deteriorates due to light reflected from outside.

In order to solve several problems including the aforementioned problem, one or more exemplary embodiments include a display apparatus having improved reliability and visibility.

Additional exemplary embodiments will be set forth in part in the description which follows and, in part, will be apparent from the description, or may be learned by practice of the presented exemplary embodiments.

According to one or more exemplary embodiments, a display apparatus includes a substrate, a light-emitting diode ("LED") provided above the substrate, an insulating layer provided above the LED, and a wire grid polarizer ("WGP") provided above the insulating layer.

In an exemplary embodiment, the insulating layer may expose an upper surface of the LED.

In an exemplary embodiment, the WGP may contact the upper surface of the LED.

In an exemplary embodiment, a height of an upper surface of the insulating layer may be equal to or less than a height of the upper surface of the LED with reference to the substrate.

In an exemplary embodiment, an opening that exposes the upper surface of the LED may be defined in the insulating layer.

In an exemplary embodiment, the LED may include a p-n diode, a first contact electrode, and a second contact electrode, where the first contact electrode and the second contact electrode are provided in the upper surface of the LED.

In an exemplary embodiment, the display apparatus may further include a first electrode provided above the substrate, and a reflection layer interposed between the LED and the first electrode.

In an exemplary embodiment, the display apparatus may further include a pixel defining layer including a concave region that exposes a central portion of the first electrode, where the reflection layer is provided above the concave region.

In an exemplary embodiment, the display apparatus may further include a pixel protection layer provided above the LED.

In an exemplary embodiment, the pixel protection layer may cover the reflection layer.

In an exemplary embodiment, the pixel protection layer may further include fine particles.

In an exemplary embodiment, the display apparatus may further include a second electrode provided above the pixel protection layer, where an opening that exposes at least a part of the upper surface of the LED is defined in the pixel protection layer, and where the second electrode contacts at least a part of the upper surface of the LED through the opening.

In an exemplary embodiment, the display apparatus may further include a first electrode and a second electrode provided above a same layer of the substrate, where the LED is electrically connected to the first electrode and the second electrode.

In an exemplary embodiment, the LED may include an upper surface, a lower surface, and a side surface connecting the upper surface and the lower surface and further includes a metal layer provided to cover the side surface of the LED.

In an exemplary embodiment, the LED may include a p-n diode, a first contact electrode, and a second contact electrode, where the first contact electrode and the second contact electrode are provided in a same side.

BRIEF DESCRIPTION OF THE DRAWINGS

These and/or other exemplary embodiments will become apparent and more readily appreciated from the following description of the exemplary embodiments, taken in conjunction with the accompanying drawings in which.

DETAILED DESCRIPTION

Figure 1:
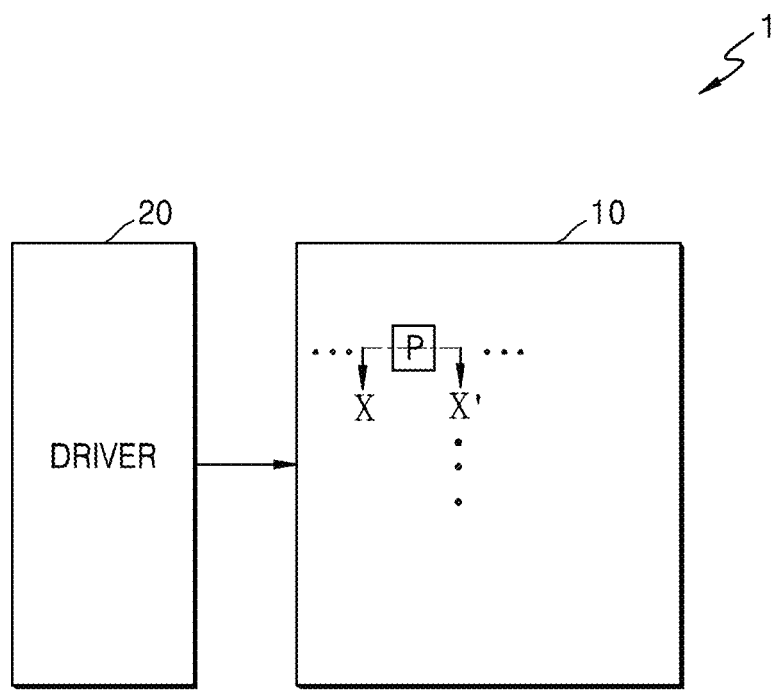
FIG. 1 is a plan view schematically illustrating an exemplary embodiment of a display apparatus according to the invention.

As the invention allows for various changes and numerous exemplary embodiments, exemplary embodiments will be illustrated in the drawings and described in detail in the written description. Advantages and features of one or more exemplary embodiments and methods of accomplishing the same may be understood more readily by reference to the following detailed description of the one or more exemplary embodiments and the accompanying drawings. The invention may, however, be embodied in many different forms and should not be construed as being limited to the one or more exemplary embodiments set forth herein.

Reference will now be made in detail to exemplary embodiments, examples of which are illustrated in the accompanying drawings. Like reference numerals in the drawings denote like elements, and a repeated description thereof will be omitted.

While such terms as "first" and "second" may be used to describe various components, such components must not be limited to the above terms. The above terms are used only to distinguish one component from another. The singular forms "a," "an," and "the" used herein are intended to include the plural forms as well, unless the context clearly indicates otherwise.

It will be understood that terms such as "include," "comprise," and "have" used herein specify the presence of stated features or components, but do not preclude the presence or addition of one or more other features or components. It will be further understood that when a layer, region, or component is referred to as being "on" another layer, region, or component, it can be directly or indirectly on the other layer, region, or component. That is, for example, intervening layers, regions, or components may be present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Sizes of components in the drawings may be exaggerated for convenience of explanation. In other words, since sizes and thicknesses of components in the drawings are arbitrarily illustrated for convenience of explanation, exemplary embodiments are not limited thereto.

An x-axis, a y-axis and a z-axis are not limited to three axes of a rectangular coordinate system and may be interpreted in a broader sense. For example, the x-axis, the y-axis, and the z-axis may be perpendicular to one another or may represent different directions that are not perpendicular to one another.

When an exemplary embodiment may be implemented differently, a specific process order may be performed differently from the described order. For example, two consecutively described processes may be performed substantially at the same time or performed in an order opposite to the described order. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 2:
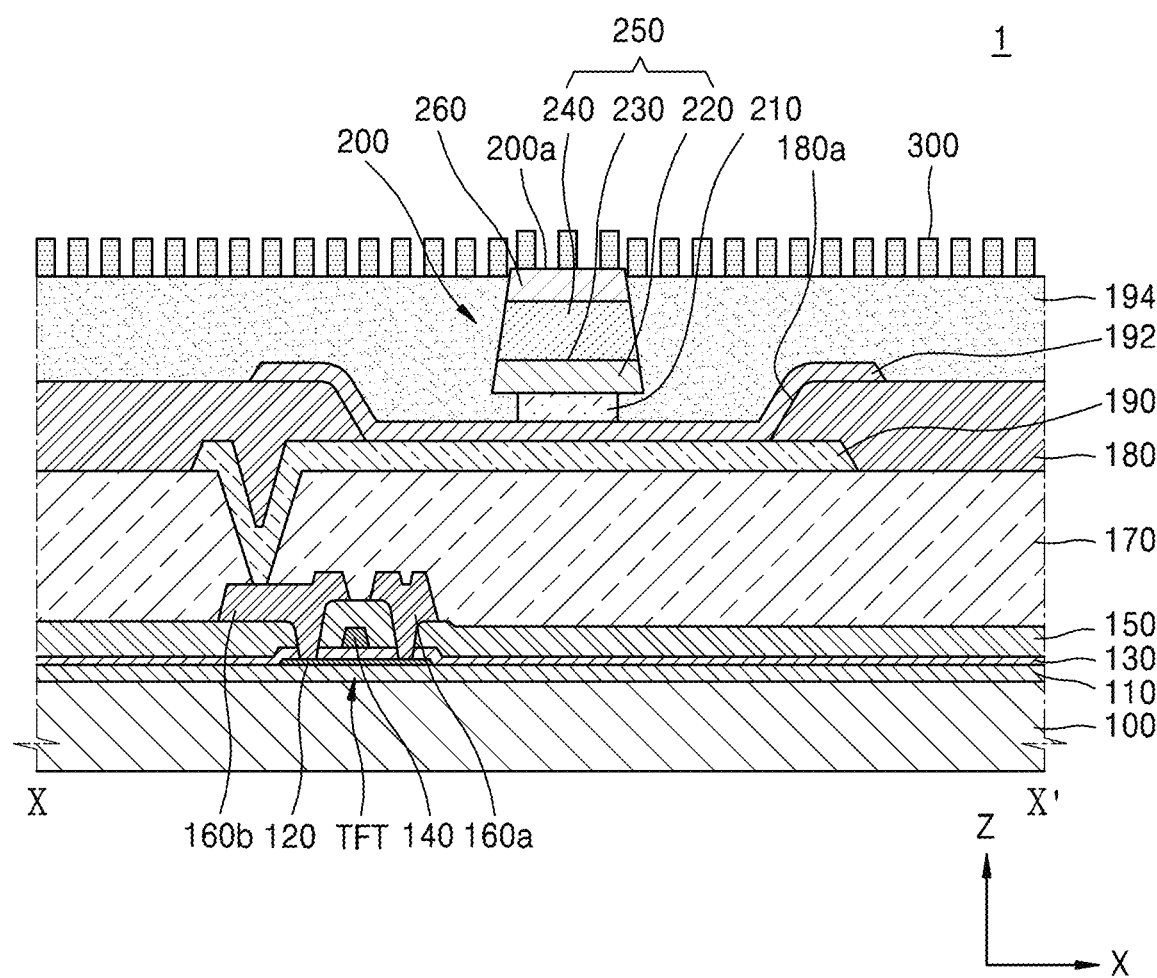
FIG. 2 is a schematic cross-sectional view taken along line X-X' of FIG. 1.

FIG. 1 is a plan view schematically illustrating a display apparatus 1 according to an exemplary embodiment. FIG. 2 is a schematic cross-sectional view taken along line X-X' of FIG. 1.

Referring to FIG. 1, the display apparatus 1 may include a display 10 and a driver 20. The display 10 may include a plurality of pixels P above a substrate that are arranged in a matrix shape. The driver 20 may include a scan driver applying a scan signal to a scan line connected to a pixel P and a data driver applying a data signal to a data line. The driver 20 may be provided in a non-display area of the substrate around the display 10 where the pixels P are arranged. The driver 20 may be in a form of an integrated circuit ("IC") chip to be directly disposed (e.g., mounted) above the substrate 10 where the display 10 is arranged, disposed (e.g., mounted) above a flexible printed circuit film, adhered onto the substrate in a form of a tape carrier package ("TCP"), or directly provided at the substrate.

Referring to FIG. 2, the display apparatus 1 according to an exemplary embodiment may include a substrate 100, a light emitting diode ("LED") 200 above the substrate 100, an insulating layer 194 above the LED 200, and a wire grid polarizer ("WGP") 300 above the insulating layer 194.

In an exemplary embodiment, the substrate 100 may include various materials such as a glass material, a metallic material, or a plastic material such as polyethyeleneterephalate ("PET"), polyethyelenen napthalate ("PEN"), polyimide, etc.

A buffer layer 110 may be provided above the substrate 100. A thin film transistor TFT and the LED 200 may be provided above the buffer layer 110.

The buffer layer 110 may prevent impure atoms from penetrating through the substrate 100 and may flatten a surface of the substrate 100. In an exemplary embodiment, the buffer layer 110 may include an inorganic material, such as silicon nitride ($SIN_x$) and/or silicon oxide ($SiO_x$) in a single layer structure or a multilayer structure. A semiconductor layer 120 may be located above the buffer layer 110.

A gate electrode 140 may be arranged in an upper portion of the semiconductor layer 120. A source electrode 160a and a drain electrode 160b may electrically communicate with each other according to a signal applied to the gate electrode 140. In an exemplary embodiment, the gate electrode 140 may include at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) in a single layer structure or a multilayer structure in consideration of adhesion with adjacent layers, planarization of surfaces of stacked layers, processability, etc.

In this regard, to achieve insulation between the semiconductor layer 120 and the gate electrode 140, a gate electrode layer 130 including silicon nitride $SIN_x$ and/or silicon oxide $SiO_x$ may be interposed between the semiconductor layer 120 and the gate electrode 140.

An interlayer insulating layer 150 may be provided above an upper portion of the gate electrode 140. In an exemplary embodiment, the interlayer insulating layer 150 may include a material, such as silicon nitride ($SIN_x$) and/or silicon oxide ($SiO_x$) in a single layer structure or a multilayer structure, for example.

The source electrode 160a and the drain electrode 160b may be arranged in an upper portion of the interlayer insulating layer 150. The source electrode 160a and the drain electrode 160b may be electrically connected to the semiconductor layer 120 through a contact hole defined in the interlayer insulating layer 150 and the gate insulating layer 130. In an exemplary embodiment, the source electrode 160a and the drain electrode 160b may include at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) in a single layer structure or a multilayer structure in consideration of conductivity, etc., for example.

Although not shown, a protection layer (not shown) may be arranged to cover the thin film transistor TFT in order to protect the thin film transistor TFT having the structure described above. In an exemplary embodiment, the protection layer may include, for example, an inorganic material, such as silicon nitride ($SIN_x$), silicon oxide ($SiO_x$), and/or silicon nitrogen oxide (SiNOx).

A planarization layer 170 may be disposed above the substrate 100. The planarization layer 170 may generally flatten an upper surface of the thin film transistor TFT and protect the thin film transistor TFT and various devices when the LED 200 is arranged in an upper portion of the thin film transistor TFT. In an exemplary embodiment, the planarization layer 170 may include, for example, an acryl-based organic material or a benzocyclobutene ("BCB"), etc. In this regard, the buffer layer 110, the gate insulating layer 130, the interlayer insulating layer 150, and the planarization layer 170 may be disposed on an entire surface of the substrate 100.

A pixel defining layer 180 may be arranged in an upper portion of the thin film transistor TFT. The pixel defining layer 180 may be located above the planarization layer 170 and may include a concave region 180a defining a pixel area. The concave region 180a may expose a central portion of a first electrode 190. The LED 200 may be disposed (e.g., mounted) in the concave region 180a.

In an exemplary embodiment, the pixel defining layer 180 may include, for example, an organic insulating layer. Examples of the organic insulating material may include an acryl-based polymer, such as polymethylmethacrylate ("PMMA") or polystyrene ("PS"), a polymer derivative having a phenol-based group, an imide-based polymer, an arylether-based polymer, an amide-based polymer, a fluorine-based polymer, a p-xylene-based polymer, a vinyl alcohol-based polymer, and a combination thereof.

The first electrode 190 may be disposed above the planarization layer 170. The first electrode 190 may be electrically connected to the thin film transistor TFT through a contact hole defined in the planarization layer 170. Although the first electrode 190 is connected to the drain electrode 160b of the thin film transistor TFT in FIG. 2, according to another exemplary embodiment, the first electrode 190 may be connected to the source electrode 160a of the thin film transistor TFT. The first electrode 190 may expose a central portion through the concave region 180a provided in the pixel defining layer 180. The LED 200 may be disposed (e.g., mounted) in the exposed central portion.

The first electrode 190 may be provided as a (semi)transparent electrode or a reflective electrode. In an exemplary embodiment, when the first electrode 190 is provided as the (semi)transparent electrode, the first electrode 190 may include, for example, indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In an exemplary embodiment, when the first electrode 190 is provided as the reflective electrode, the first electrode 190 may include, for example, a reflection layer including Ag, Mg, Al, Pt, Pd, Au, Ni, Nd, Ir, Cr, or a combination thereof, and a layer including ITO, IZO, ZnO, $In_2O_3$, IGO, or AZO. However, the invention is not limited thereto. The first electrode 190 may include various other materials and may have various modifications such as a single layer structure or a multilayer structure.

The LED 200 may be disposed above the first electrode 190. In an exemplary embodiment, the LED 200 may be a micro LED, for example. In this regard, the term 'micro' may indicate a size ranging from about 1 micrometer (μm) to about 100 μm but the invention is not limited thereto. The LED 200 may also be applied to an LED having a size greater or smaller than the micro size. A single LED 200 or a plurality of LEDs 200 may be picked up on a wafer by a transfer tool and may be transferred to the substrate 100, and thus the LED 200 may be accommodated in the concave region 180a of the pixel defining layer 180 above the substrate 100. In an exemplary embodiment, the LED 200 may be a red, green, blue, or white LED or an ultraviolet ("UV") LED, for example.

The LED 200 may include a p-n diode 250, a first contact electrode 210, and a second contact electrode 260. The first contact electrode 210 and/or the second contact electrode 260 may include one or more layers and may include various conductive materials including a metal, a conductive oxide, and conductive polymers, for example. The first contact electrode 210 and the second contact electrode 260 may selectively include a reflection layer, for example, a silver layer. The first contact electrode 210 may be electrically connected to the first electrode 190. The second contact electrode 260 may be electrically connected to the WGP 300. The p-n diode 250 may include a lower p-doping layer 220, one or more quantum well layers 230, and an upper n-doping layer 240. In another exemplary embodiment, the upper doping layer 240 may be a p-doping layer, and the lower doping layer 220 may be an n-doping layer. The p-n diode 250 may have a rectilinear side wall or a downwardly or upwardly tapered side wall.

An example of the LED 200 is illustrated as a vertical micro LED in FIG. 2 but the invention is not limited thereto. In other exemplary embodiments, the LED 200 may be a flip micro LED, a horizontal micro LED, etc., in which the first contact electrode 210 and the second contact electrode 260 are arranged in the same direction. In this case, locations of the first electrode 190 and a second electrode (e.g., WGP 300) may correspond to locations of the first contact electrode 210 and the second contact electrode 260.

A reflection layer 192 may be interposed between the first electrode 190 and the LED 200. The reflection layer 192 may partially cover the central portion of the first electrode 190 exposed through the concave region 180a and side and upper surfaces of the pixel defining layer 180. The reflection layer 192 may be arranged to cover the side surfaces of the pixel defining layer 180, i.e., the concave region 180a, and have a concave shape. Through the aforementioned structure, light emitted from the LED 200 may be reflected from the reflection layer 192, thereby improving light extraction efficiency.

In an exemplary embodiment, the reflection layer 192 may function as a reflection electrode, may include a reflection layer including, for example, Ag, Mg, Al, Pt, Pd, Au, Ni, Nd, Ir, Cr, or a combination thereof, and may selectively further include a layer including ITO, IZO, ZnO, $In_2O_3$, IGO, or AZO. However, the invention is not limited thereto. The reflection layer 192 may include various materials and may have various modifications such as a single layer structure or a multilayer structure.

The insulating layer 194 may surround the LED 200 inside the concave region 180a of the pixel defining layer 180. The insulating layer 194 may fill a space between the concave region 180a of the pixel defining layer 180 and the LED 200, thereby covering the concave region 180a and the reflection layer 192. The insulating layer 194 may include an organic insulating material. In an exemplary embodiment, for example, the insulating layer 194 may include acryl, PMMA, BCB, polyimide, acrylate, epoxy, polyester, etc., but is not limited thereto. The insulating layer 194 may function to flatten an upper surface so that the WGP 300 may be arranged in an upper portion of the insulating layer 194.

The insulating layer 194 may expose an upper surface 200a of the LED 200. In an exemplary embodiment, the insulating layer 194 may have a height not to cover the second contact electrode 260 located in the upper surface 200a of the LED 200 so that the second contact electrode 260 may be exposed, for example. A height of the insulating layer 194 may be equal to or less than a height of the LED 200 in order not to cover the second contact electrode 260 located in the upper surface 200a of the LED 200.

The WGP 300 may be arranged in an upper portion of the insulating layer 194. The WGP 300 of the exemplary embodiment may be configured as a regular array of fine metal wires aligned in parallel. The WGP 300 may perform the same function as a general polarizer but may have metal wires aligned at a gap below a wavelength of incident light without orientating a material forming the polarizer and may be advantageously easy in terms of patterning. The WGP 300 may be arranged in the upper portion of the LED 200, thereby improving visibility that may deteriorate due to reflection of external light.

The WGP 300 may be in direct contact with the second contact electrode 260 of the LED 200 having the exposed upper surface 200a that is not covered by the insulating layer 194. The WGP 300 may be provided as the array of fine metal wires so that the WGP 300 may be in direct contact with the second contact electrode 260 of the LED 200 and may function as a common electrode. The WGP 300 may be located above an entire surface of the insulating layer 194 located in a display area. As described above, the WGP 300 may function as not only a polarizing layer but also as the common electrode by directly contacting the second contact electrode 260 of the LED 200, and thus the WGP 300 may be in electrical contact with an electrode power supply line outside the display area.

The WGP 300 described above may act as the common electrode, and thus a separate common electrode is unnecessary, thereby simplifying a process. The WGP 300 may be provided as the array of the fine metal wires so that each wire functions as a cooling pin, and thus the WGP 300 may function to easily emit light and heat generated together from the LED 200 to outside.

Figure 3:
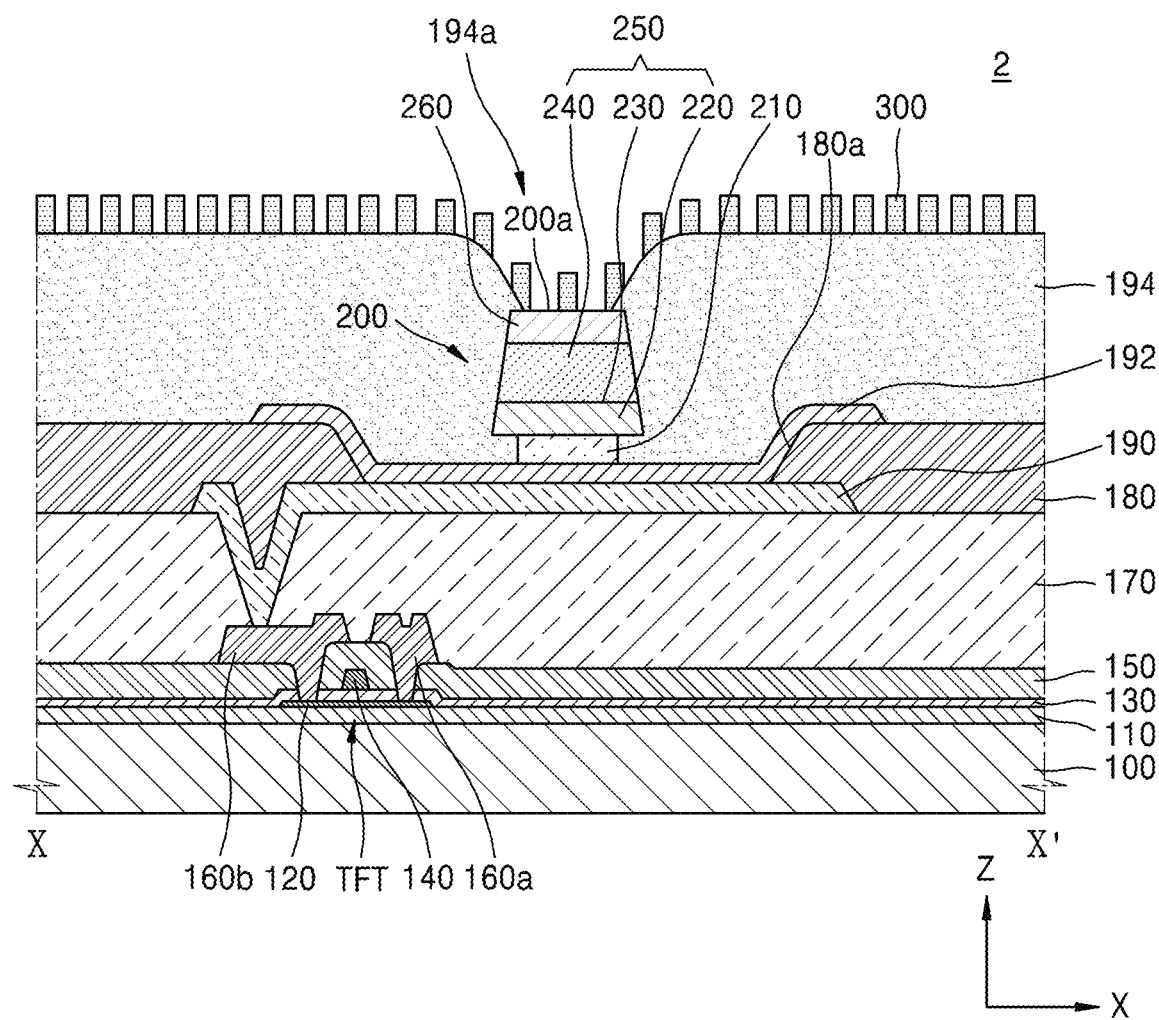
FIG. 3 is a cross-sectional view schematically illustrating another exemplary embodiment of a display apparatus according to the invention.

FIG. 3 is a cross-sectional view schematically illustrating a display apparatus 2 according to another exemplary embodiment.

Referring to FIG. 3, the display apparatus 2 according to an exemplary embodiment may include the substrate 100, the LED 200 above the substrate 100, the insulating layer 194 which is disposed above the LED 200 and in which an open portion, i.e. an opening 194a, exposing at least a part of the upper surface 200a of the LED 200 is defined, and the WGP 300 above the insulating layer 194.

The display apparatus 2 according to an exemplary embodiment is different from the display apparatus 1 described above in a structure of the insulating layer 194. A difference in the structure of the insulating layer 194 will be described below and other configurations of the display apparatus 2 are the same as those of the display apparatus 1 described above, and thus redundant descriptions thereof are omitted.

The insulating layer 194 may surround the LED 200 inside the concave region 180a of the pixel defining layer 180. The insulating layer 194 may fill a space between the concave region 180a of the pixel defining layer 180 and the LED 200, thereby covering the concave region 180a and the reflection layer 192. The insulating layer 194 may include an organic insulating material. The insulating layer 194 may function to flatten an upper surface so that the WGP 300 may be arranged in an upper portion of the insulating layer 194.

The insulating layer 194 may expose the upper surface 200a of the LED 200. In an exemplary embodiment, the insulating layer 194 may have a height greater than a height of the LED 200 with reference to the substrate 100, and the opening 194a exposing the upper surface 200a of the LED 200 may be defined in the insulating layer 194, for example. The opening 194a of the insulating layer 194 may expose the upper surface 200a of the LED 200 wholly or at least partially. In an exemplary embodiment, the second contact electrode 260 located in the upper surface 200a of the LED 200 may be exposed by the opening 194a, for example.

The WGP 300 may be arranged in an upper portion of the insulating layer 194. The WGP 300 may be arranged in an upper portion of the LED 200, thereby improving visibility that may deteriorate due to reflection of external light. The WGP 300 may be disposed above the upper surface 200a of the LED 200 exposed by the opening 194a, and thus the WGP 300 may be in direct contact with the second contact electrode 260 of the LED 200. That is, the WGP 300 may be located above an entire surface of the insulating layer 194 and may be in direct contact with the second contact electrode 260 of the LED 200, thereby functioning as a common electrode.

As described above, the WGP 300 may act as the common electrode, and thus a separate common electrode is unnecessary, thereby simplifying a process. The WGP 300 may be provided as an array of fine metal wires so that each wire functions as a cooling pin, and thus the WGP 300 may function to easily emit light and heat generated together by the LED 200 to outside.

Figure 4:
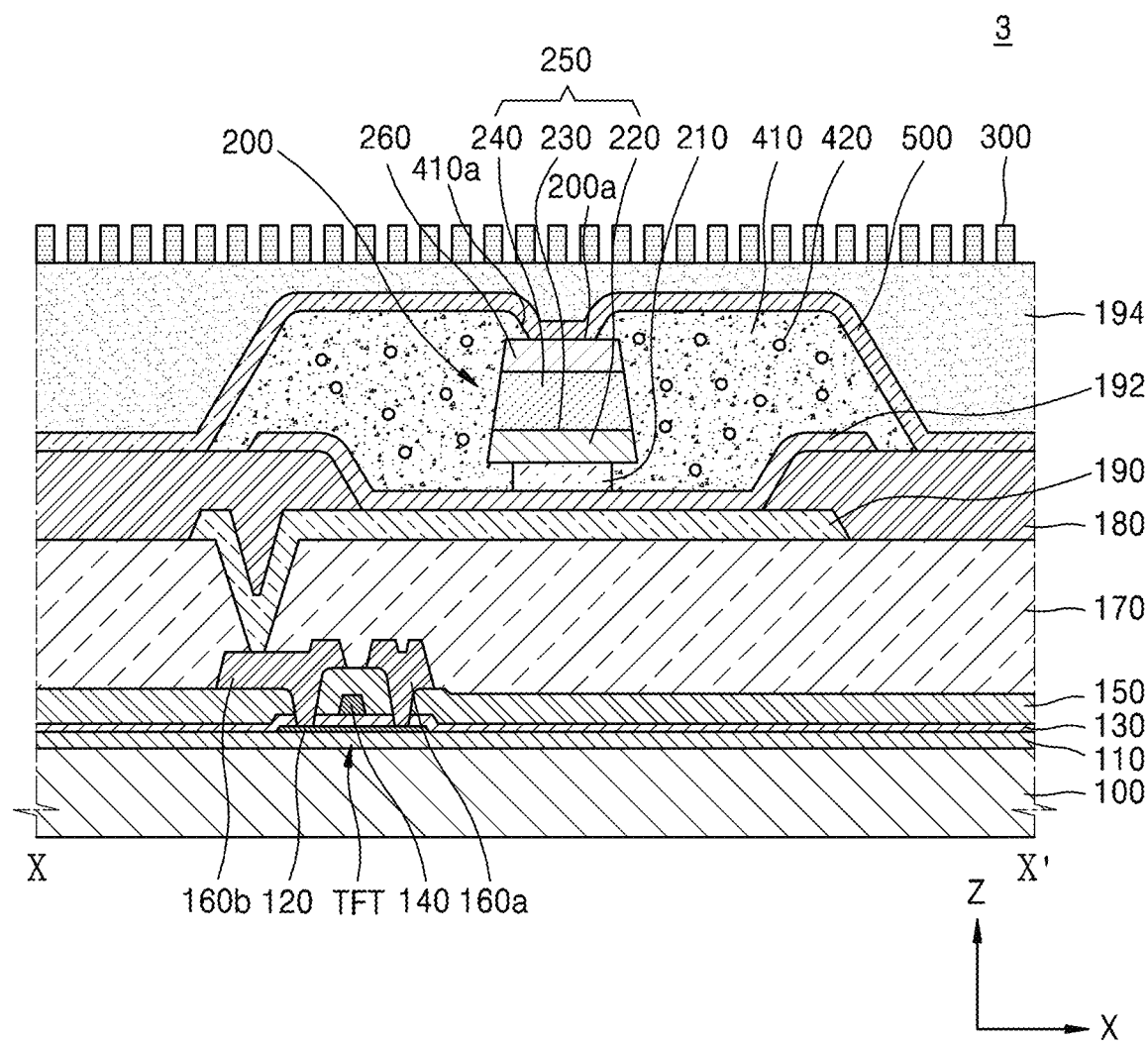
FIG. 4 is a cross-sectional view schematically illustrating another exemplary embodiment of a display apparatus according to the invention.

FIG. 4 is a cross-sectional view schematically illustrating a display apparatus 3 according to another exemplary embodiment.

Referring to FIG. 4, the display apparatus 3 according to an exemplary embodiment may include the substrate 100, the LED 200 above the substrate 100, the insulating layer 194 above the LED 200, the WGP 300 above the insulating layer 194, and a pixel protection layer 410 and a second electrode 500 interposed between the LED 200 and the insulating layer 194.

A structure of the LED 200 of the display apparatus 3 according to an exemplary embodiment is the same as that of the display apparatus 1 of FIG. 2, and thus a redundant description thereof is omitted.

The LED 200 may be disposed above the reflection layer 192. In an exemplary embodiment, the LED 200 may be a micro LED, for example. In this regard, the term 'micro' may indicate a size ranging from about 1 µm to about 100 µm but the invention is not limited thereto. The LED 200 may also be applied to an LED having a size greater or smaller than the micro size. A single LED 200 or a plurality of LEDs 200 may be picked up on a wafer by a transfer tool and may be transferred to the substrate 100, and thus the LED 200 may be accommodated in the concave region 180a of the pixel defining layer 180 above the substrate 100. In an exemplary embodiment, the LED 200 may be a red, green, blue, or white LED or an UV LED, for example.

The pixel protection layer 410 may be further disposed above the LED 200. The pixel protection layer 410 may surround the LED 200 inside the concave region 180a of the pixel defining layer 180. The pixel protection layer 410 may fill a space between the concave region 180a of the pixel defining layer 180 and the LED 200, thereby covering the concave region 180a and the reflection layer 192. The pixel protection layer 410 may include an organic insulating material. An upper surface of the pixel protection layer 410 may be generally flat but may be, for example, curved. The pixel protection layer 410 may cover the reflection layer 192 including all patterned side surfaces. The reflection layer 192 may function as an auxiliary electrode, and thus the pixel protection layer 410 may wholly cover the reflection layer 192, thereby preventing a short with the second electrode 500 that will be described later.

The pixel protection layer 410 may include a plurality of fine particles 420 that may function to scatter and diffuse light emitted in the LED 200. The fine particles 420 may be single particles and core-shell type particles. The fine particles 420 may include a light reflection material or a light scattering material, for example, an organic material such as transparent resin, an inorganic material such as a glass material or a silicon compound, metal or a combination thereof. In an exemplary embodiment, when the fine particles 420 include transparent resin, the fine particles 420 may include, for example, one of PMMA, polysterene, polyurethane, epoxy, and silicon resin.

The pixel protection layer 410 may expose the upper surface 200a of the LED 200. In an exemplary embodiment, the pixel protection layer 410 may have a height greater than a height of the LED 200 with reference to the substrate 100, and an open portion exposing the upper surface 200a of the LED 200, i.e., an opening 410a, may be defined in the pixel protection layer 410, for example. The opening 410a, as shown in FIG. 4, may expose an upper surface of the LED 200, i.e., at least a part of the second contact electrode 260, through an upper surface of the pixel protection layer 410 having an inwardly sunken shape, the pixel protection layer 410 having a height greater than the height of the LED 200 with reference to the substrate 100. In another exemplary embodiment, the height of the upper surface of the pixel protection layer 410 may be equal to the height of the LED 200 with reference to the substrate 100 so that at least a part of the second contact electrode 260 may be exposed to outside.

The opening 410a of the pixel protection layer 410 may expose the upper surface 200a of the LED 200 wholly or at least partially. In an exemplary embodiment, the second contact electrode 260 located in the upper surface 200a of the LED 200 exposed by the opening 410a may be exposed, for example. Although a height of the pixel protection layer 410 is greater than the height of the upper surface 200a of the LED 200 with reference to the substrate 100, and the upper surface 200a of the LED 200 is exposed through the opening 410a in FIG. 4, according to another exemplary embodiment, the height of the pixel protection layer 410 may be equal to or less than the upper surface 200a of the LED 200 with reference to the substrate 100, and the upper surface 200a of the LED 200 may be exposed.

The second electrode 500 may be disposed above the pixel protection layer 410. The second electrode 500 may be arranged in an entire surface of the substrate 100 as a common electrode. The second electrode 500 may contact the LED 200 through the opening 410a of the pixel protection layer 410 that exposes at least a part of the upper surface 200a of the LED 200. In an exemplary embodiment, the second contact electrode 260 may be located in the upper surface 200a of the LED 200 and may be electrically connected to the second contact electrode 260 of the LED 200 through the opening 410a of the pixel protection layer 410, for example.

The second electrode 500 may be provided as a (semi) transparent electrode or a reflective electrode. In an exemplary embodiment, when the second electrode 500 is provided as the (semi)transparent electrode, the second electrode 500 may include a layer including metal having a small work function, i.e., Li, Ca, LiF/Ca, LiF/Al, Ag, Mg, and a combination thereof and a (semi)transparent conductive layer including ITO, IZO, ZnO or $In_2O_3$. In an exemplary embodiment, when the second electrode 500 is provided as the reflective electrode, the second electrode 500 may include the layer including Li, Ca, LiF/Ca, LiF/Al, Ag, Mg, and a combination thereof, for example. The configuration and material of the second electrode 500 are not limited thereto and may vary in various ways.

The insulating layer 194 may be disposed above the second electrode 500. The insulating layer 194 may cover the second electrode 500, may insulate the second electrode 500 and the WGP 300 that will be described later, and simultaneously, may flatten an upper surface so that the WGP 300 may be arranged thereabove. The insulating layer 194 may include an organic insulating material.

The WGP 300 may be arranged in an upper portion of the insulating layer 194. The WGP 300 of the exemplary embodiment may be configured as a regular array of fine metal wires aligned in parallel. The WGP 300 may perform the same function as a general polarizer but may align metal wires at a gap below a wavelength of incident light without orientating a material forming the polarizer and may be advantageously easy to patterning. The WGP 300 may be arranged in the upper portion of the LED 200, thereby improving visibility that deteriorates due to reflection of external light.

The WGP 300 may be provided as the array of the fine metal wires so that each wire functions as a cooling pin, and thus the WGP 300 may function to easily emit light and heat generated together from the LED 200 to outside.

Figure 5:
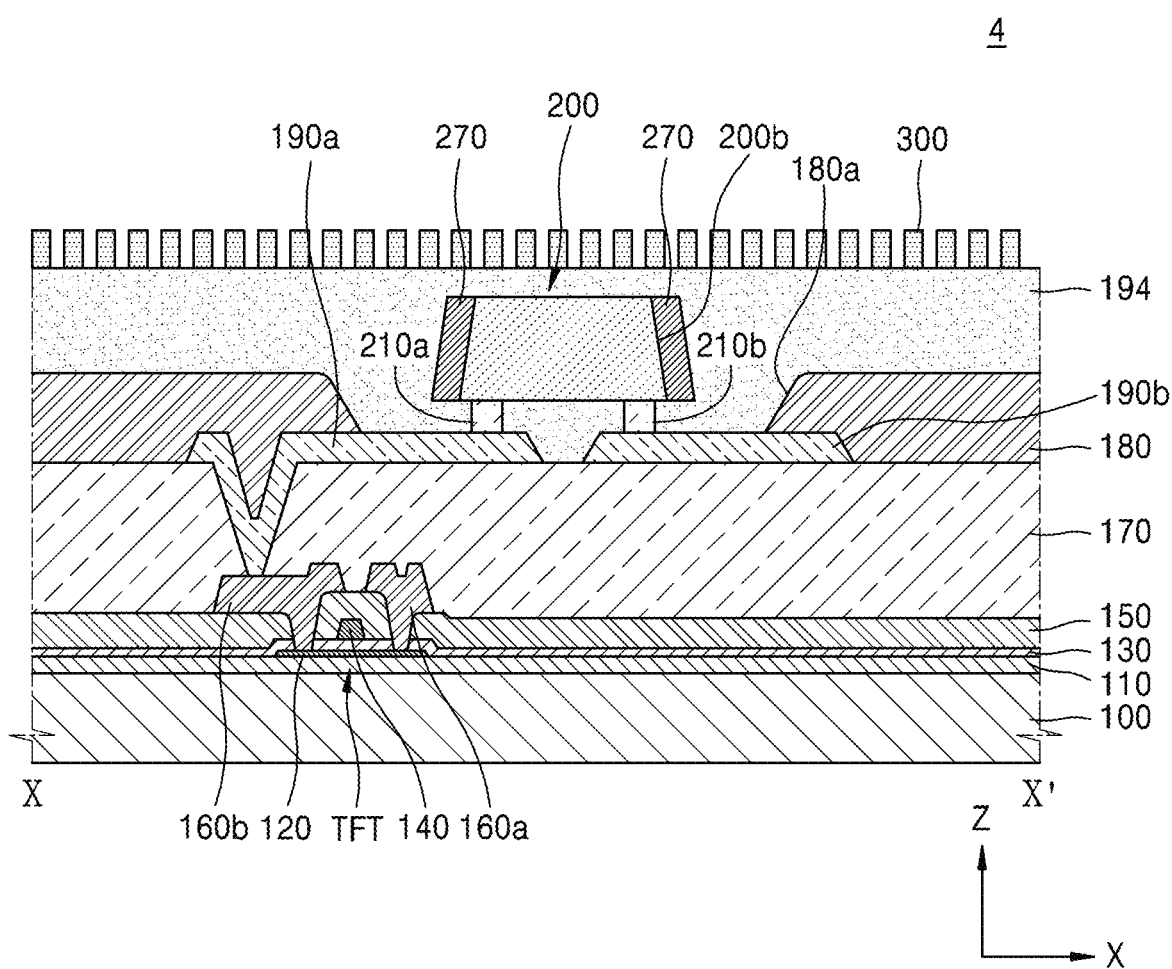
FIG. 5 is a cross-sectional view schematically illustrating another exemplary embodiment of a display apparatus according to the invention.

FIG. 5 is a cross-sectional view schematically illustrating a display apparatus 4 according to another exemplary embodiment.

Referring to FIG. 5, the display apparatus 4 according to an exemplary embodiment may include the substrate 100, the LED 200 above the substrate 100, a first electrode 190a and a second electrode 190b that are electrically connected to the LED 200, the insulating layer 194 above the LED 200, and the WGP 300 above the insulating layer 194.

Structures of the thin film transistor TFT and the planarization layer 170 covering the thin film transistor TFT of the display apparatus 4 according to the exemplary embodiment are the same as those of the display apparatus 1 of FIG. 2, and thus redundant descriptions thereof are omitted.

The first electrode 190a and the second electrode 190b may be disposed above the planarization layer 170. The first electrode 190a may be electrically connected to the thin film transistor TFT through a contact hole defined in the planarization layer 170. The second electrode 190b may be arranged in one side of the first electrode 190a. In the exemplary embodiment, the first electrode 190a and the second electrode 190b may be arranged at the same layer. In an exemplary embodiment, the first electrode 190a and the second electrode 190b may be disposed above the planarization layer 170, for example. Here, the first electrode 190a and the second electrode 190b arranged at the same layer may mean the first electrode 190a and the second electrode 190b electrically connected to the LED 200 in the same side. When the first electrode 190a and the second electrode 190b are arranged at the same layer, the LED 200 may be a flip LED or a horizontal LED in which a first contact electrode and a second contact electrode are arranged in the same direction.

The first electrode 190a and the second electrode 190b may be provided as (semi)transparent electrodes or reflective electrodes. In an exemplary embodiment, when the first electrode 190a and the second electrode 190b are provided as the (semi)transparent electrodes, the first electrode 190a and the second electrode 190b may include, for example, ITO, IZO, ZnO, $In_2O_3$, IGO, or AZO. In an exemplary embodiment, when the first electrode 190a and the second electrode 190b are provided as the reflective electrodes, the first electrode 190a and the second electrode 190b may include reflection layers including Ag, Mg, Al, Pt, Pd, Au, Ni, Nd, Ir, Cr, or a combination thereof, and layers including ITO, IZO, ZnO, $In_2O_3$, IGO, or AZO. However, the invention is not limited thereto. The first electrode 190a and the second electrode 190b may include various other materials and have various modifications such as a single layer structure or a multilayer structure.

The pixel defining layer 180 may be disposed above the thin film transistor TFT. The pixel defining layer 180 may be located above the planarization layer 170 and may include the concave region 180a defining a pixel area. The concave region 180a may expose at least a part of the first electrode 190a and at least a part of the second electrode 190b. The LED 200 may be disposed (e.g., mounted) in the concave region 180a. In an exemplary embodiment, the pixel defining layer 180 may include, for example, an organic insulating layer.

The LED 200 may be disposed above the first electrode 190a and the second electrode 190b. In an exemplary embodiment, the LED 200 may be a micro LED, for example. In this regard, the term 'micro' may indicate a size ranging from about 1 μm to about 100 μm but the invention is not limited thereto. The LED 200 may also be applied to an LED having a size greater or smaller than the micro size. A single LED 200 or a plurality of LEDs 200 may be picked up on a wafer by a transfer tool and may be transferred to the substrate 100, and thus the LED 200 may be accommodated in the concave region 180a of the pixel defining layer 180 above the substrate 100. In an exemplary embodiment, the LED 200 may be a red, green, blue, or white LED or an UV LED, for example.

The LED 200 may include a p-n diode (not shown), a first contact electrode (not shown), and a second contact electrode (not shown). The first contact electrode and/or the second contact electrode may include one or more layers and may include various conductive materials including metal, a conductive oxide, and conductive polymers. In an exemplary embodiment, the first contact electrode and the second contact electrode may selectively include the reflection layer 192 (refer to FIGS. 2, 3 and 4), for example, a silver layer. The first contact electrode may be electrically connected to the first electrode 190a. The second contact electrode may be electrically connected to the second electrode 190b. The p-n diode may include a p-doping layer of one side thereof, one or more quantum well layer, and an n-doping layer of another side thereof.

In the exemplary embodiment, the LED 200 may be a flip micro LED, a horizontal micro LED, etc., in which the first contact electrode and the second contact electrode are arranged in the same direction. In this case, locations of the first electrode 190a and the second electrode 190b may correspond to locations of the first contact electrode and the second contact electrode.

The LED 200 may have an upper surface, a lower surface, and a side surface 200b connecting the upper surface and the lower surface. A metal layer 270 may be arranged to cover the side surface 200b of the LED 200. The metal layer 270 may surround the side surface 200b of the LED 200 as shown in FIG. 5 and may cover only a part of the side surface 200b according to another exemplary embodiment. Although not shown, an insulating layer may be interposed between the side surface 200b of the LED 200 and the metal layer 270 to electrically insulate the p-n diode and the metal layer 270. Through the aforementioned structure, light emitted from the LED 200 may be reflected from the metal layer 270, thereby improving light extraction efficiency. The first and second contact electrodes 210a and 210b may connect the first and second electrodes 190a and 190b, respectively, to the LED 200.

In an exemplary embodiment, the metal layer 270 may include a reflection layer including, for example, Ag, Mg, Al, Pt, Pd, Au, Ni, Nd, Ir, Cr, or a combination thereof, and may selectively further include a layer including ITO, IZO, ZnO, $In_2O_3$, IGO, or AZO. However, the invention is not limited thereto. The metal layer 270 may include various materials and may have various modifications such as a single layer structure or a multilayer structure.

The insulating layer 194 may surround the LED 200 inside the concave region 180a of the pixel defining layer 180. The insulating layer 194 may fill a space between the concave region 180a of the pixel defining layer 180 and the LED 200, thereby covering the concave region 180a and the reflection layer 192. In an exemplary embodiment, the insulating layer 194 may include an organic insulating material, for example. In an exemplary embodiment, for example, the insulating layer 194 may include acryl, PMMA, BCB, polyimide, acrylate, epoxy, polyester, etc., but is not limited thereto. The insulating layer 194 may cover the upper surface 200a of the LED 200 to flatten an upper surface so that the WGP 300 may be arranged in an upper portion of the insulating layer 194.

The WGP 300 may be arranged in an upper portion of the insulating layer 194. The WGP 300 of the exemplary embodiment may be configured as a regular array of fine metal wires aligned in parallel. The WGP 300 may perform the same function as a general polarizer but may align metal wires at a gap below a wavelength of incident light without orientating a material forming the polarizer and may be advantageously easy to patterning. The WGP 300 may be arranged in the upper portion of the LED 200, thereby improving visibility that deteriorates due to reflection of external light.

The WGP 300 may be provided as the array of the fine metal wires so that each wire functions as a cooling pin, and thus the WGP 300 may function to easily emit light and heat generated together from the LED 200 to outside.

As described above, according to one or more exemplary embodiments, a display apparatus having improved reliability and visibility may be implemented. However, the scope of the invention is not limited to the effect.

It should be understood that exemplary embodiments described herein should be considered in a descriptive sense only and not for purposes of limitation. Descriptions of features within each exemplary embodiment should typically be considered as available for other similar features in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:
1. A display apparatus comprising:
a substrate;
a reflection layer disposed above the substrate;
an insulating layer disposed on the reflection layer;
a polarizer on the insulating layer;
a light-emitting diode interposed between the reflection layer and the polarizer; and
a first electrode and a second electrode electrically connected to the light-emitting diode;
wherein the insulating layer is in direct contact with an upper surface defining the second electrode, and interposed between the second electrode and the polarizer.
2. The display apparatus of claim 1, further comprising:
a thin film transistor disposed on the substrate and comprising a semiconductor layer, a gate electrode, a source electrode, and a drain electrode,
wherein the reflection layer is electrically connected to the thin film transistor.
3. The display apparatus of claim 2, wherein the first electrode is disposed above the substrate,
wherein the reflection layer disposed on the first electrode, and electrically connected to the thin film transistor via the first electrode.

4. The display apparatus of claim 1, further comprising:
a pixel defining layer comprising a concave region which exposes a central portion of the first electrode,
wherein the reflection layer is disposed above the concave region.
5. The display apparatus of claim 1, further comprising: a pixel protection layer disposed above the light-emitting diode.
6. The display apparatus of claim 5, wherein the pixel protection layer covers the reflection layer.
7. The display apparatus of claim 5, wherein the pixel protection layer further comprises fine particles.
8. The display apparatus of claim 5,
wherein the light-emitting diode comprises a p-n diode, a first contact electrode, and a second contact electrode,
wherein the second electrode disposed above the pixel protection layer,
wherein an opening which exposes at least a part of an upper surface of the second contact electrode is defined in the pixel protection layer, and
wherein the second electrode contacts at least a part of the upper surface of the second contact electrode through the opening.
9. A display apparatus comprising:
a substrate;
a reflection layer disposed above the substrate;
an insulating layer disposed on the reflection layer;
a polarizer on the insulating layer; and
a light-emitting diode interposed between the reflection layer and the polarizer,
wherein the polarizer contacts an upper surface of the light-emitting diode.
10. The display apparatus of claim 9, wherein the insulating layer exposes an upper surface of the light-emitting diode.
11. The display apparatus of claim 9, wherein a height of an upper surface of the insulating layer is equal to or less than a height of an upper surface of the light-emitting diode with reference to the substrate.
12. The display apparatus of claim 9, wherein an opening which exposes an upper surface of the light-emitting diode is defined in the insulating layer.
13. A display apparatus comprising:
a substrate;
an insulating layer disposed on the substrate;
a polarizer directly on the insulating layer;
a light-emitting diode interposed between the substrate and the polarizer and disposed in the insulating layer;
a first contact electrode and a second contact electrode both extend from the light-emitting diode toward the substrate; and
a first electrode and a second electrode electrically connected to the light-emitting diode via the first and second contact electrodes, respectively, disposed therebetween the light-emitting diode and the first and second electrodes,
wherein the insulating layer is in direct contact with side s surfaces of the first electrode and the second electrode facing each other.
14. The display apparatus of claim 13, wherein the light-emitting diode comprises a p-n diode, a first contact electrode, and a second contact electrode,
wherein the first contact electrode and the second contact electrode are disposed on a lower surface of the light-emitting diode.
15. The display apparatus of claim 13, wherein the light-emitting diode comprises an upper surface, a lower surface, and a side surface connecting the upper surface and the lower surface of the light-emitting diode, and further comprises a metal layer disposed to cover the side surface of the light-emitting diode.

16. The display apparatus of claim 13, wherein the light-emitting diode comprises a p-n diode, a first contact electrode, and a second contact electrode,
wherein the first contact electrode and the second contact electrode are disposed on the lower surface of the light-emitting diode.

17. A display apparatus comprising:
a substrate;
a reflection layer disposed above the substrate;
an insulating layer disposed on the reflection layer;
a polarizer on the insulating layer; and
a light-emitting diode interposed between the reflection layer and the polarizer,
wherein the polarizer includes a wire grid polarizer.

* * * * *